United States Patent
Vaucher

(10) Patent No.: US 9,267,987 B2
(45) Date of Patent: Feb. 23, 2016

(54) APPARATUS FOR TESTING WAFERS

(71) Applicant: ETEL S.A., Motiers (CH)

(72) Inventor: Jean-Marc Vaucher, Couvet (CH)

(73) Assignee: ETEL S.A., Motiers (CH)

( * ) Notice: Subject to any disclaimer, the term of this patent is extended or adjusted under 35 U.S.C. 154(b) by 0 days.

(21) Appl. No.: 14/415,143

(22) PCT Filed: May 29, 2013

(86) PCT No.: PCT/EP2013/061077
§ 371 (c)(1),
(2) Date: Jan. 16, 2015

(87) PCT Pub. No.: WO2014/016018
PCT Pub. Date: Jan. 30, 2014

(65) Prior Publication Data
US 2015/0185280 A1 Jul. 2, 2015

(30) Foreign Application Priority Data
Jul. 26, 2012 (DE) .......... 10 2012 014 812

(51) Int. Cl.
*G01R 31/28* (2006.01)
*G01R 1/067* (2006.01)

(52) U.S. Cl.
CPC ........ *G01R 31/2891* (2013.01); *G01R 1/06705* (2013.01); *G01R 31/2887* (2013.01)

(58) Field of Classification Search
CPC ........... G01R 1/06705; G01R 31/2887; G01R 31/2891
See application file for complete search history.

(56) References Cited

U.S. PATENT DOCUMENTS

| | | | |
|---|---|---|---|
| 5,451,131 A * | 9/1995 | Hecht | H01L 21/67126 118/50 |
| 5,555,422 A | 9/1996 | Nakano | |
| 5,732,636 A * | 3/1998 | Wang | B60L 13/06 104/284 |
| 5,760,564 A | 6/1998 | Novak | |
| 5,804,982 A * | 9/1998 | Lo | G01R 1/06705 324/750.22 |
| 6,531,793 B1 | 3/2003 | Frissen et al. | |
| 6,784,678 B2 | 8/2004 | Pietzschmann | |
| 6,906,546 B2 | 6/2005 | Tanioka et al. | |
| 7,656,174 B2 | 2/2010 | Kasukabe et al. | |
| 7,942,099 B2 | 5/2011 | Ro et al. | |
| 2002/0149383 A1* | 10/2002 | Colby | G01R 31/2648 324/750.22 |
| 2004/0239353 A1* | 12/2004 | Gudin | G01R 31/2887 324/750.23 |
| 2010/0148814 A1 | 6/2010 | Yalei et al. | |

FOREIGN PATENT DOCUMENTS

| | | |
|---|---|---|
| DE | 10039336 A1 | 2/2002 |
| EP | 0615131 A1 | 9/1994 |
| WO | 2007024031 A1 | 3/2007 |

* cited by examiner

Primary Examiner — Tung X Nguyen
Assistant Examiner — Adam Clarke
(74) Attorney, Agent, or Firm — Leydig, Voit & Mayer, Ltd.

(57) ABSTRACT

An apparatus for testing integrated circuits includes a test probe having test contacts configured to be pressed onto electrical contacts of a substrate and a frame to which the test probe is attached. A substrate support is configured to hold the substrate. A magnetic element is configured to generate a force with which the test contacts are pressed onto the electrical contacts of the integrated circuit. The magnetic element includes at least three magnet actuators which each have a distance sensor associated therewith and which are arranged around the substrate support such that distances between the magnet actuators and the frame, and between the substrate support and the test probe, are adjustable.

10 Claims, 2 Drawing Sheets

APPARATUS FOR TESTING WAFERS

CROSS-REFERENCE TO PRIOR APPLICATIONS

This application is a U.S. National Stage Application under 35 U.S.C. §371 of International Application No. PCT/EP2013/061077 filed on May 29, 2013 and claims benefit to German Patent Application No. DE 10 2012 014 812.7 filed on Jul. 26, 2012. The International Application was published in German on Jan. 30, 2014 as WO 2014/016018 A1 under PCT Article 21(2).

FIELD

The present invention relates to an apparatus for testing wafers, also referred to as tester. Such testers are used to test integrated circuits on a wafer before they are separated from each other and packaged into separate housings.

BACKGROUND

A typical configuration of a tester is described in U.S. Pat. No. 6,906,546 and schematically shown in FIG. 1. A wafer 6 rests on a substrate support 5. Attached to the frame 1 of the tester is a replaceable test probe 7, which is matched to the integrated circuit to be tested and which contacts, with its resilient test contacts 8, the electrical contacts of the wafer (i.e., the so-called bond pads of the integrated circuits, to which the bonding wires will be connected later) and connects the electrical contacts to electronics for testing the integrated circuits. Substrate support 5 is disposed on a Z-theta stage 4, by substrate support 5 can be moved along the Z-direction toward test contacts 8 and to be rotated about this Z-direction. Z-theta stage 4 is disposed on two intersecting linear axes 2, 3, by which substrate support 5 can be moved in the X- and Y-directions.

Wafer 6 is aligned with test probe 7 by means of the two linear axes 2, 3 and the axis of rotation of Z-theta stage 4. The Z-theta stage then presses the wafer onto test contacts 8, and a test program is started.

The spring force of an individual test contact 8 is small. However, since a large number of such test contacts come into action simultaneously, the force with which wafer 6 must be pressed against test probe 7 may be in the range of several thousands of newtons. In a tester according to FIG. 1, this large force between test probe 7 and wafer 6 must be transmitted to substrate support 5 via frame 1, linear axes 2, 3 and Z-theta stage 4, as is indicated by force loop 9. Therefore, all of these elements must be designed to withstand such forces. The individual components must be of correspondingly large and heavy construction.

In order to enable movement in the X- and Y-directions, it is also possible to use devices other than that illustrated in FIG. 1. Suitable devices include, for example, gantry arrangements as well as intersecting linear axes, such as described in U.S. Pat. No. 5,760,564, or planar motors, such as illustrated in U.S. Pat. No. 6,531,793. What is important is that the substrate support is movable relative to the test probe in two linearly independent directions parallel to a plane of the substrate support.

It has been proposed already in U.S. Pat. No. 7,656,174 to use a vacuum or a magnetic element (electromagnet) to generate the force between the test probe and the wafer. In this way, the force for pressing the test contacts onto the electrical contacts acts directly between the substrate support and the test probe. The frame of the tester and the other components are not loaded by these large forces and may be made lighter and smaller.

According to Moore's Law, future generations of integrated circuits will become increasingly more integrated and be made with finer structures and, therefore, will require increasingly complex tests. Reliable contacting of increasing numbers of increasingly smaller electrical contacts using increasingly finer test contacts requires increasingly precise process control, not only during manufacture of the integrated circuits, but also during testing.

SUMMARY

In an embodiment, the present invention provides an apparatus for testing integrated circuits. A test probe has test contacts configured to be pressed onto electrical contacts of a substrate and the test probe is attached to a frame. A substrate support is configured to hold the substrate. A magnetic element is configured to generate a force with which the test contacts are pressed onto the electrical contacts of the integrated circuit. The magnetic element includes at least three magnet actuators which each have a distance sensor associated therewith and which are arranged around the substrate support such that distances between the magnet actuators and the frame, and between the substrate support and the test probe, are adjustable.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
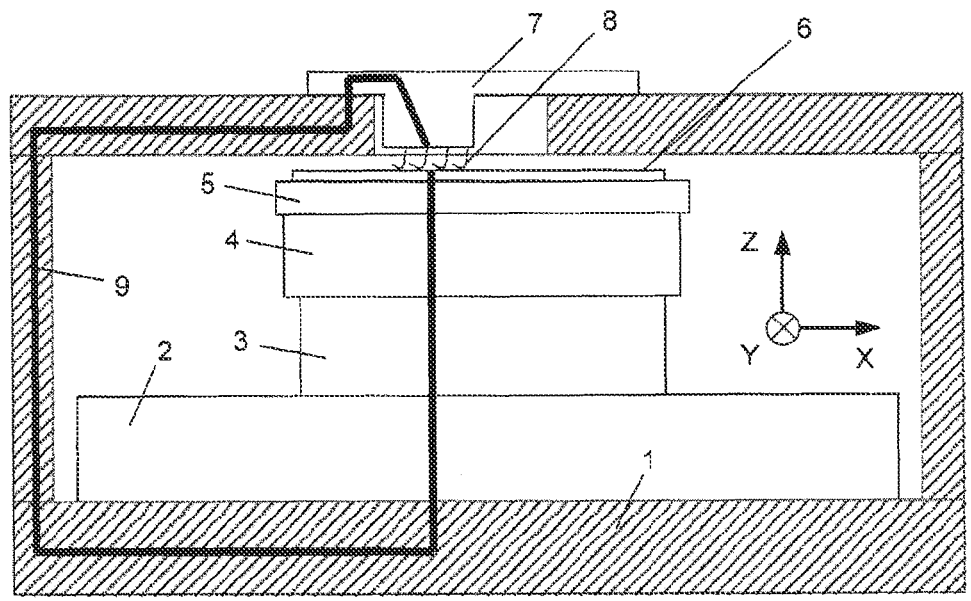
FIG. 1 is a view showing an apparatus for testing integrated circuits in accordance with the prior art.

In an embodiment, the present invention provides an apparatus for testing integrated circuits which allows for particularly good process control during testing of integrated circuits.

In an embodiment, an apparatus for testing integrated circuits uses a test probe having test contacts. The test contacts are pressed onto electrical contacts of a substrate, such as a wafer having integrated circuits. The apparatus has a frame to which the test probe is attached, as well as a substrate support for holding the substrate. A magnetic element generates the force with which the test contacts are pressed onto the electrical contacts of the integrated circuit. For this purpose, at least three magnet actuators are used which each have a distance sensor associated therewith and which are arranged around the substrate support such that the distances between the magnet actuators and the frame, and thus between the substrate support and the test probe, can be adjusted by means of a controller.

The force exerted by the at least three magnet actuators acts directly between the test probe (or between the frame to which the test probe is attached) and the substrate support. The magnetic circuit bridges the mechanical gap in which are located the resilient test contacts. The spring constant of these test contacts and the distance between the test probe and the substrate determine the contact force, which does not stress the remaining mechanics of the tester.

The use of three or more magnet actuators allows the distance between the test probe and the substrate support to be adjusted in a very uniform fashion. Many different influences, which could lead to an irregular distance profile within the substrate or within the integrated circuit to be tested, can be compensated for by control techniques. For example, the stress on the substrate support varies considerably depending on whether the respective substrate is currently being tested at its center or rather at the edge. If the contact force does not act centrally, the substrate support will tend to tilt, which can be counteracted by suitably controlling the three or more magnet actuators.

Moreover, the mechanics of the Z-theta stage and the linear axes can be considerably relieved of stress, which allows the tester to be made significantly lighter.

This is because now this Z-axis no longer needs to apply the contact force, but only needs to bring the substrate support and the substrate close to the test probe, while only having to overcome the gravity of the parts being moved. To this end, only a relatively small force is required over a large travel range (several centimeters) of the substrate support. In the last portion of the travel range (several tenths of a millimeter), which is important for the actual testing and in which contact is made between the bond pads and the test contacts, the magnet actuators assume the force generation task, thereby reducing stress on the mechanics disposed therebelow for positioning the substrate support.

Overall, this reduces the masses moved, makes positioning faster and more accurate, and reduces the vibrations that are transmitted into the floor at the location where the tester is installed. In addition, the reduced force in the vertical Z-direction prevents mechanical deformations, whereby positioning of the substrate becomes more accurate in the horizontal X-Y direction as well.

FIG. 1 shows an apparatus for testing integrated circuits in accordance with the prior art and was already described in the introduction.

Figure 2:
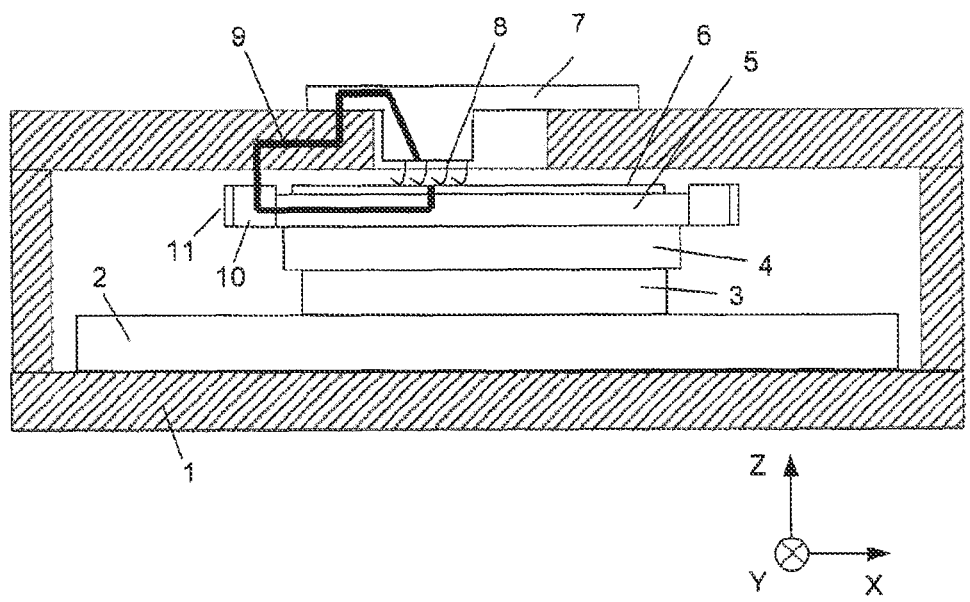
FIG. 2 is a side view of an apparatus for testing integrated circuits in accordance with an embodiment of the present invention.

FIG. 2 shows an apparatus for testing integrated circuits in accordance with an embodiment of the present invention, where components already described in FIG. 1 are given the same reference numerals. New in this embodiment are magnet actuators 10 which are arranged at intervals around substrate support 5. In order to permit adjustment of the distance between substrate support 5 and frame 1, or the test probe 7 attached thereto, each magnet actuator 10 also has a distance sensor 11 associated therewith. Distance sensors 11 are preferably in the form of inductive distance sensors. However, it is also possible to use other sensors which may, for example, be based on capacitive or optical effects.

Each magnet actuator 10 is composed of an E-shaped iron core carrying one or more wound coils. A current flowing through the coils causes a magnetic flux through the iron core. The free legs of the iron core are oriented toward the ferromagnetic regions of frame 1 in such a way that the magnetic circuit is closed through these ferromagnetic regions. A magnetic attractive force is generated between magnet actuators 10 and the ferromagnetic regions of frame 1, the magnetic attractive force tending to reduce the air gap between magnet actuators 10 and frame 1. This force, which is also called reluctance force, is directed oppositely to the spring force of test contacts 8 and generates the contact force with which test contacts 8 of test probe 7 are pressed onto the electrical contacts of substrate 6 to be tested.

For the magnitude of the force, the following relation holds approximately: $F=K*i^2/d^2$, where i is the current through the coil, d is the size of the air gap, and K is a constant with the unit $Nm^2/A^2$. Thus, the force is proportional to the square of the current and inversely proportional to the square of the size of the air gap. The usable range of the magnet actuator is about 1 mm, because outside this region, the magnetic forces become too small.

In a preferred embodiment, a coil is wound around the central leg of the E-shaped iron core, the coil filling the spaces toward the two outer legs. The central leg having the coil wound therearound should then be about twice as wide as the two outer legs in order to obtain similar magnetic flux densities in each leg. In addition, the central leg carries a permanent magnet which, in the rest position, approximately balances the force of gravity or even provides a portion of the contact force. Thus, an overall force in both directions (upward and downward) can be caused by a variable current. Moreover, the permanent magnet reduces the maximum required current, thereby reducing thermal stress.

In FIG. 2, it can readily be seen that the force loop 9 for generating the contact force is now significantly smaller than in the apparatus shown in FIG. 1. X-axis 2, Y-axis 3 and Z-theta stage 4 are not loaded by this contact force, and frame 1 must resist this force only in a small portion thereof.

Figure 3:
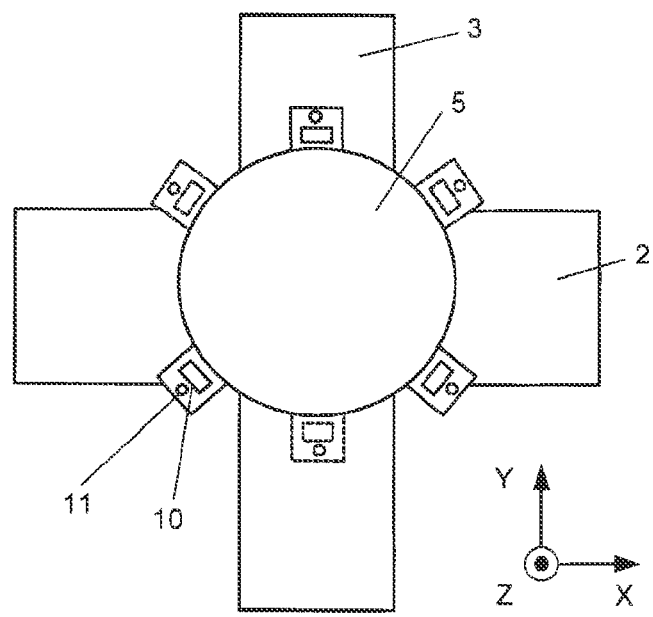
FIG. 3 is a plan view of the apparatus of FIG. 2.

FIG. 3 shows a top view of several components of the tester of FIG. 2. In this view, there can be seen intersecting linear axes 2, 3 and substrate support 5 disposed thereon. Three magnet actuators 10, which each have a distance sensor 11 associated therewith, are shown arranged around substrate support 5 at regular angular intervals. In one exemplary embodiment, three such magnet actuators 10 are spaced 120 degrees apart from each other (drawn with solid lines), while in another exemplary embodiment, three additional such magnet actuators 10 (drawn with dashed lines) are provided, so that, in the case of a regular arrangement, the distance between two adjacent magnet actuators is only 60 degrees.

The use of three or more such actuators 10 and associated distance sensors 11 has the advantage that substrate support 5 is not only adjustable in a Z-direction, but also tiltable about the X- and Y-directions (within certain limits). Since distance measurement is performed at each magnet actuator 10, the tilt can be adjusted selectively. Thus, substrate 6 is positionable in all 6 degrees of freedom. Adjustment in directions X and Y is done using linear axes 2, 3, while prepositioning in the Z-direction and the rZ-rotation (i.e., rotation about the Z-axis) are accomplished using Z-theta stage 4. During testing of a wafer, fine positioning in the Z-direction (and thus the contact force), as well as the rX- and rY-tilts (about the X- and Y-axes) are effected by suitably controlling magnet actuators 10. The mobility required to tilt substrate support 5 may be provided by means of suitable links (e.g., leaf springs) if the elasticities existing within the system are not sufficient.

The use of more than three magnet actuators 10 may be required, when in extreme positions of substrate support 5 (i.e., during testing of peripheral regions of the wafer), individual actuators 10 are no longer located opposite the ferromagnetic regions of frame 1 and, therefore, are unable to generate a force.

Figure 4:
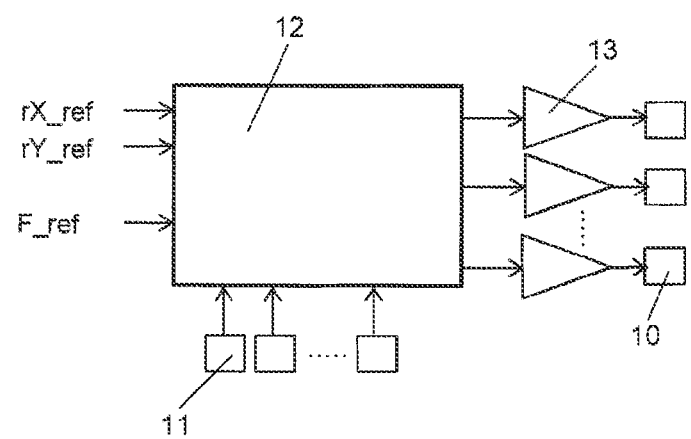
FIG. 4 is a view showing a device for controlling magnet actuators of the apparatus for testing integrated circuits.

FIG. 4 shows a controller 12 for controlling magnet actuators 10. This controller may be configured as a single input, single output (SISO) controller, in which a separate PID controller is present for each sensor/actuator pair. However, such a structure is disadvantageous when there are more sensor/actuator pairs than degrees of freedom to be controlled. In this case, a multiple input, multiple output (MIMO) controller is preferred. Here, the signals from all sensors 11 are first converted into Z, rX and rY coordinates (sensor transformation), which are each supplied to a respective PID controller, so that now there is exactly one PID controller for each degree of freedom. The outputs of these controllers are then converted into control signals for magnet actuators 10 (actuator transformation). Despite the increased computational effort required for the transformations, MIMO controllers are preferred because they provide better results.

The most important input to this controller 12 is the reference value for the contact force F_ref, or, equivalent thereto (because of the linear relationship between the spring force and the deflection of test contacts 8), the reference value for the distance between substrate support 5 and test probe 7. The two reference values can be used equivalently and differ only by a constant from each other. Moreover, it is possible to input a tilt rX_ref or rY_ref to be able to adjust the two degrees of freedom rX and rY. In most application cases, these inputs will be zero. One application case where the inputs are different from zero could be when a wedge-shaped substrate 6 is considered, so that, despite the wedge shape of substrate 6, all test contacts will experience the same compression, and thus the same contact force.

Also supplied to controller 12 are the distances measured by distance sensors 11. Based on the input values rX_ref, rY_ref, F_ref, controller 12 then calculates reference values for the currents in magnet actuators 10. These reference values are provided to amplifiers 13, because these adjust currents in magnet actuators 10.

Instead of inputting a distance or a force, magnet actuators 10 could also be controlled in such a way that the Z-axis of Z-theta stage 4 will not have to support any load or will only have to support a small load. To this end, a maximum current for the Z-axis of Z-theta stage 4 is input to controller (12), so that the Z-axis is relieved of load, and the actual contact force (at least the major part thereof) is provided by magnet actuators 10. Input of a distance between wafer 6 and test probe 7 may then be accomplished via the control circuit of Z-theta stage 4, as in the prior art.

A wafer 6 typically carries a large number of identical integrated circuits, which must be tested in succession. Therefore, the wafer must be repeatedly repositioned in the X- and Y-directions, and thus tested in a stepwise manner. When peripheral regions of the wafer are tested, there is a risk of substrate support 5 being tilted by the high contact force. This force is compensated by the input rX_ref=rY_ref=0, but this control process requires a certain amount of time. In order to reduce this time and thereby speed up the overall testing process, it is possible to pre-control the occurring tilt. This is because if controller 12 knows the position to be currently tested, it can calculate the currents needed in magnet actuators 10 to compensate for the tilting forces, and to use the calculated currents as pre-control values in the current control loops. Thus, controller 12 has a feed forward control which, during activation of magnet actuators 10, allows forces to be distributed among the individual magnet actuators 10 according to the X-Y position of substrate support 5 relative to test probe 7. Thus, controller 12 only needs to compensate for real disturbances and inaccuracies, but not for effects that are actually known.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An apparatus for testing integrated circuits, comprising:
a test probe having test contacts configured to be pressed onto electrical contacts of a substrate,
a frame to which the test probe is attached,
a substrate support configured to hold the substrate, and
a magnetic element configured to generate a force with which the test contacts are pressed onto the electrical contacts of the integrated circuit, the magnetic element including at least three magnet actuators which each have a distance sensor associated therewith and which are arranged around the substrate support such that distances between the magnet actuators and the frame, and between the substrate support and the test probe, are adjustable.

2. The apparatus as recited in claim 1, wherein the substrate support is movable relative to the test probe in two linearly independent directions parallel to a plane of the substrate support.

3. The apparatus as recited in claim 2, wherein the substrate support is movable relative to the frame in a first direction of the two directions by means of a first driven linear axis, and wherein a second linear axis is disposed on and perpendicular to the first linear axis and allows the substrate support to be moved in a second direction of the two directions.

4. The apparatus as recited in claim 2, wherein the substrate support is disposed on a Z-theta stage by which the substrate is movable in a third direction perpendicular to each of the first and second directions and rotatable about the third direction.

5. The apparatus as recited in claim 1, wherein a defined contact force or a defined distance between the substrate support and the test probe is inputable to a controller so as to control the magnet actuators.

6. The apparatus as recited in claim 4, wherein a maximum current for a Z-axis of the Z-theta stage is inputable to a controller.

7. The apparatus as recited in claim 5, wherein a tilt of the substrate support about the first or the second direction is adjustable by the controller.

8. The apparatus as recited in claim 5, wherein the controller has a feed forward control which is configured to allow forces to be distributed among the individual magnet actuators during activation of the magnet actuators according to a position of the substrate support relative to the test probe.

9. The apparatus as recited in claim 1, wherein the magnet actuators form a magnetic circuit which is closed through an air gap between the substrate support and ferromagnetic regions of the frame such that a reluctance force is created which counteracts a spring force of the test contacts.

10. The apparatus as recited in claim 9, wherein the magnet actuators are composed of E-shaped iron cores having legs which are oriented toward the ferromagnetic regions of the frame and which carry at least wound one coil.

* * * * *